(12) United States Patent
Alaettinoglu et al.

(10) Patent No.: US 11,695,682 B2
(45) Date of Patent: Jul. 4, 2023

(54) OPTIMIZING BORDER GATEWAY PROTOCOL (BGP) TRAFFIC USING REINFORCEMENT LEARNING

(71) Applicant: Ciena Corporation, Hanover, MD (US)

(72) Inventors: Cengiz Alaettinoglu, Sherman Oaks, CA (US); Shelley A. Bhalla, Morrisville, NC (US); Emil Janulewicz, Ottawa (CA); Thomas Triplet, Manotick (CA); David Côté, Gatineau (CA)

(73) Assignee: Ciena Corporation, Hanover, MD (US)

( * ) Notice: Subject to any disclaimer, the term of this patent is extended or adjusted under 35 U.S.C. 154(b) by 67 days.

(21) Appl. No.: 16/587,404

(22) Filed: Sep. 30, 2019

(65) Prior Publication Data

US 2021/0099378 A1  Apr. 1, 2021

(51) Int. Cl.
*H04L 45/02* (2022.01)
*G06F 30/20* (2020.01)

(52) U.S. Cl.
CPC .............. *H04L 45/08* (2013.01); *G06F 30/20* (2020.01); *H04L 45/04* (2013.01)

(58) Field of Classification Search
None
See application file for complete search history.

(56) References Cited

U.S. PATENT DOCUMENTS

| | | | |
|---|---|---|---|
| 7,120,792 B1 * | 10/2006 | Jacobson | H04L 9/3271 713/153 |
| 7,197,573 B1 * | 3/2007 | Jacobson | H04L 43/0882 709/239 |
| 7,539,191 B1 * | 5/2009 | Jacobson | H04L 63/1441 370/392 |
| 10,917,331 B1 * | 2/2021 | Zaki | H04L 43/028 |
| 2007/0174105 A1 * | 7/2007 | Abe | G06Q 10/0637 705/7.29 |
| 2018/0248905 A1 * | 8/2018 | Côté | H04L 41/145 |

FOREIGN PATENT DOCUMENTS

| | | | | |
|---|---|---|---|---|
| EP | 1 843 283 A1 | 10/2007 | | |
| EP | 1843283 A1 * | 10/2007 | ........... | H04L 41/046 |

OTHER PUBLICATIONS

Nov. 17, 2020, International Search Report and Written Opinion for International Application No. PCT/US2020/053210.
Jiang et al., "Survey on Deep Learning for the Routing Layer of Computer Networks", 2019 UK/China Emerging Technologies (UCET), IEEE, pp. 1-4.

* cited by examiner

*Primary Examiner* — Yemane Mesfin
*Assistant Examiner* — Jeff Banthrongsack
(74) *Attorney, Agent, or Firm* — Baratta Law PLLC; Lawrence A. Baratta, Jr.

(57) ABSTRACT

Systems, methods, and computer-readable media including software logic are provided for optimizing Border Gateway Protocol (BGP) traffic in a telecommunications network. In one embodiment, systems and methods include, with a current state of one or more inter-Autonomous Systems (AS) links, causing performance of an action in the telecommunication network, determining a metric based on the action to determine an updated current state of the one or more inter-AS links, and utilizing the metric to perform a further action to achieve one or more rewards associated with the one or more inter-AS links.

20 Claims, 11 Drawing Sheets

FIG. 15

OPTIMIZING BORDER GATEWAY PROTOCOL (BGP) TRAFFIC USING REINFORCEMENT LEARNING

FIELD OF THE DISCLOSURE

The present disclosure generally relates to networking systems and methods. More particularly, the present disclosure relates to systems and methods for optimizing Border Gateway Protocol (BGP) traffic between Autonomous Systems (ASs) within a telecommunications network, such as by using Reinforcement Learning (RL).

BACKGROUND OF THE DISCLOSURE

Presently, the Internet includes tens of thousands of Autonomous Systems (ASs) or service providers. These ASs may be used, for example, for delivering data from a plurality of content providers to a plurality of end users. Border Gateway Protocol (BGP) is a routing protocol that allows ASs to exchange routing information and data. Conventional rules-based engines may be used within a network to determine routing decisions. These routing decisions may be based on a variety of different factors, such as the various data paths that are available throughout the network, various service factors (e.g., Service Level Agreements (SLAs), Quality of Experience (QoE), etc.) that service providers may offer to customers, and other policies and rules set by network administrators and service providers.

Two neighboring nodes, also known as peers, can establish a link between them to allow the transfer of data packets. In the field of BGP, two peers within the same AS may be referred to as internal BGP (iBGP) peers. When data is transferred from a node of one AS to a node of a different AS, the data is transmitted along an external BGP (eBGP) link between eBGP peers. Routers on the edge of one AS may be referred to as border routers and are configured to directly exchange data with the border routers of a neighboring AS.

As telecommunications networks continue to grow, traffic throughout the networks may experience various types of problems, such as congestion, latency, dropped data packets, etc. Currently, there are a number of rules-based solutions that are available for solving traffic issues on a network. Most of these rules-based solutions, however, deal only with ways to balance the outbound (egress) traffic from an AS, but are unable to control inbound (ingress) traffic to an AS. Another problem with rules-based engines is that they may be difficult to maintain due to the dynamic nature of networks. Also, rules-based engines can be impractical due to the large amount of data that is typically handled on a network.

Nevertheless, even though rules-based engines may be useful in many respects, they can be extremely complex. Also, they may still be incapable of effectively optimizing traffic within a network, particularly in BGP traffic among ASs. Therefore, there is a need for optimizing BGP traffic between ASs in a flexible manner, such as by using machine learning (ML) processes, such as Reinforcement Learning (RL) or other Artificial Intelligence (AI) processes.

BRIEF SUMMARY OF THE DISCLOSURE

The present disclosure is directed various embodiments of system and methods for optimizing Border Gateway Protocol (BGP) traffic in a telecommunications network. In an embodiment, a system configured to optimize Border Gateway Protocol (BGP) traffic in a telecommunications network includes a network interface configured for communication with the telecommunication network; a processing device interconnected with the network interface; and a memory device configured to store instructions that, when executed, cause the processing device to with a current state of one or more inter-Autonomous Systems (AS) links, cause performance of an action in the telecommunication network, determine a metric based on the action to determine an updated current state of the one or more inter-AS links, and utilize the metric to perform a further action to achieve one or more rewards associated with the one or more inter-AS links. The one or more rewards can relate to optimization of one or more of inbound traffic and outbound traffic on the one or more inter-AS links. The current state and the updated current state are characterized by the metric which is a measurement based on any of ingress traffic, egress traffic, latency, dropped packets, and business metrics. The action can be a direct action for outbound traffic on the one or more inter-AS links. The action can be an indirect action to influence inbound traffic on the one or more inter-AS links. The instructions that, when executed, can further cause the processing device to receive training related to what actions are effective for the one or more rewards based on the current state. The training can include offline training using one of i) historical data based on actions taken in a production network, and ii) a simulation. The rewards can include balancing traffic across a plurality of inter-AS links, maximizing Quality of Experience, minimizing Service Layer Agreement penalties, minimizing a cost per bit, minimizing latency, minimizing a penalty to change routing data, and a combination thereof.

BRIEF DESCRIPTION OF THE DRAWINGS

The present disclosure is illustrated and described herein with reference to the various drawings, in which like reference numbers are used to denote like system components/method steps, as appropriate, and in which:

FIG. 15 is a graph illustrating a third example of anomaly detection for monitoring Network Time Protocol (NTP) amplification attacks, according to various embodiments.

DETAILED DESCRIPTION OF THE DISCLOSURE

Figure 1:
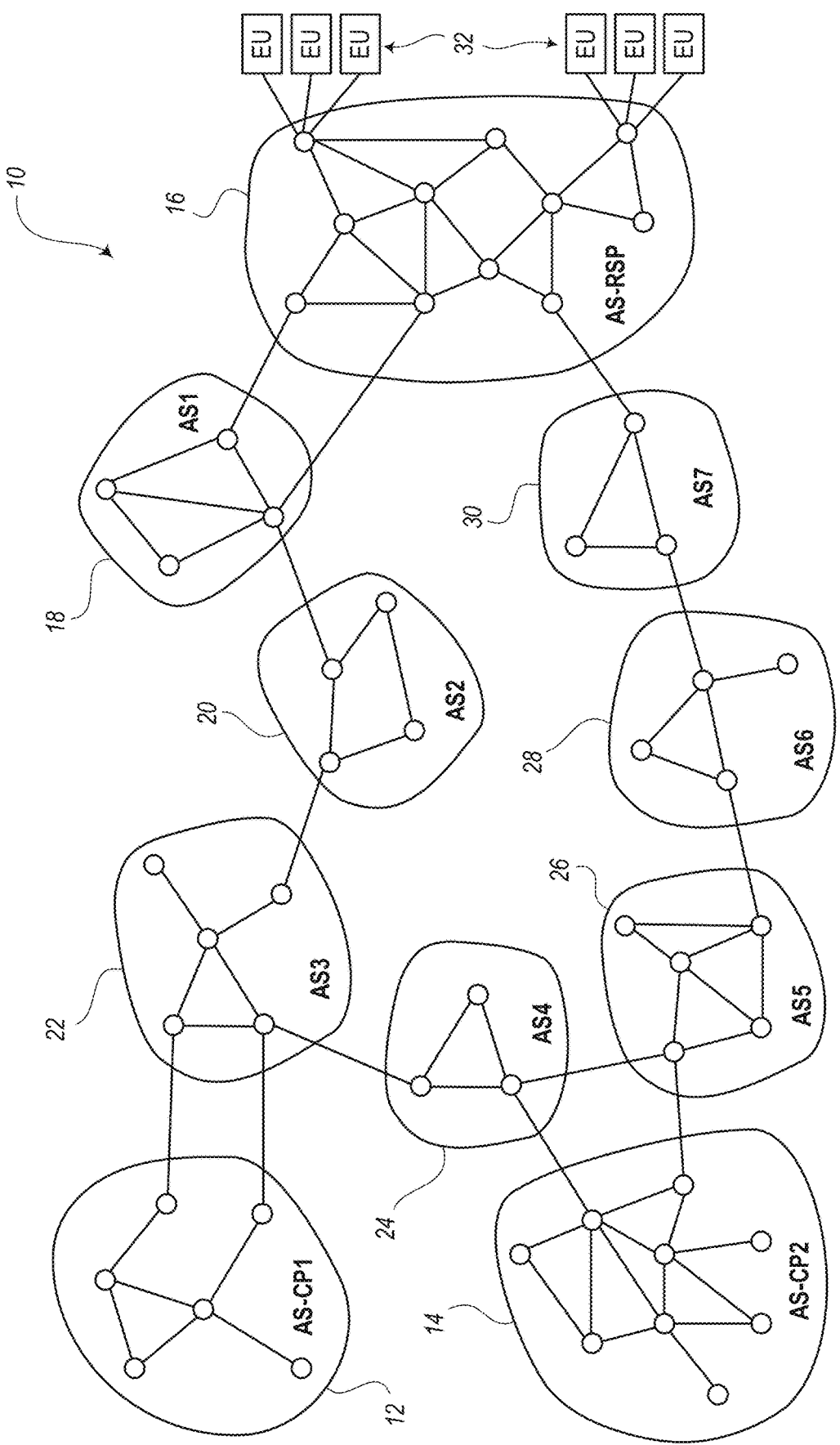
FIG. 1 is a diagram illustrating a telecommunications network where a plurality of autonomous systems (ASs) are interconnected and can communicate with each other under the Border Gateway Protocol (BGP), according to various embodiments.

Although Reinforcement Learning (RL) has been inspired by behaviorist psychology for influencing human behavior, RL can also be applied in the field of Machine Learning (ML) for influencing how machines operate. In the context of autonomous telecommunications networks, for instance, RL may be related to how agents ought to behave in a network environment to maximize some notion of cumulative reward. For example, an agent may include a network element or node in the network as well as a processing device configured to monitor and control some point in the network. In general, RL seeks to learn what to do given a problem in a network, such as by monitoring a current state to provide some action in order to maximize a positive reward (e.g., balanced data traffic) over the long-run. Often, an agent does not have any a priori knowledge of its operating environment and must discover which actions yield the most reward by trying them out. This leads to a trade-off between "exploration" (i.e., trying new things) and "exploitation" (i.e., using what is known). The agent must exploit what it already knows to obtain rewards, but also needs to explore new avenues to make better actions in the future.

Concurrently, networks are evolving to include more and more intelligence and automation, such as through control planes and/or Software Defined Networking (SDN) frameworks. It would be advantageous to apply the techniques of RL to enable autonomous, self-learning networks.

In various embodiments, the present disclosure relates to RL for autonomous telecommunications networks. In a closed-loop SDN network, RL can be applied using various software applications to learn how and when to perform network actions to adapt to changing network/policy conditions and to maintain the network in a near-optimal state. The optimal state can be defined as one minimizing some defined cost function. For example, RL can be used in packet-optical telecommunications networks. In some embodiments, systems and methods can use network simulations to train RL packet-optical applications in simulated environments, before going live. In other embodiments, the systems and methods can use imitation learning to train the RL packet-optical applications with historical data, before going live. Once trained, the RL packet-optical applications can be deployed for operation in large and complex networks.

The approaches described herein provide a new paradigm in configuring network applications. An operator only needs to specify the cost (or reward) associated with particular network metrics or events, the list of actions allowed to be performed on the network, and the list of metrics to characterize the network state. For example, in a packet network, the costs and rewards may include a cost of "−10" for dropping packets at strategic ports, a cost of "−20" for a service to be on a secondary path, and a reward of "+10" for keeping a service latency below some Service Layer Agreement (SLA) value. The allowed actions may include: doing nothing, adjusting the bandwidth allocated to a service, re-routing a service to a secondary path, among others. The metrics describing the network state may include the transmitted and received bytes at various ports, the latency of each service and the date and time of day.

Of note, the network operator does not need to determine the optimal settings of the network parameters and does not need to implement if { . . . } else { . . . } rules to control the network actions. These are learned automatically by the RL packet-optical application, which simplifies network operations significantly. To influence the network settings manually, the operator can modify the RL cost function at any point at any time, which will result in the network converging to a new optimal state. For instance, the operator may decide to raise or lower the cost of dropping packets from high-priority services or raise or lower the cost of being on a secondary path during certain times of the day.

In another embodiment, the RL, packet-optical application can be capable of learning when/how to adjust bandwidth profiles and when/how to re-route services of high and low priority in a packet network, in the presence of varying traffic patterns, using RL. For example, the costs can be "−10" for dropping packets on low-priority service, "−20" for dropping packets on high-priority service, and "−10" for any service to be on the secondary path. The actions can be, for each service, to do nothing, to set bandwidth to 1G, 4G, 10G, or some other value, or to re-route to (pre-defined) primary or secondary paths. The state can be the received (RX) bytes of each service at strategic ports and the current path of each service.

In some embodiments, the optimal policies defining what actions to take for each state can be learned offline (e.g., through simulated data, through historical data, or a combination thereof). This can include developing a state-transition probability matrix (s, s'), and then applied online on a live network. This paradigm of "reward, state, and action" allows machine learning to drive network operation. Again, static configurations of "if . . . then . . . else . . . " require expert knowledge in advance which is often lacking and which does not necessarily drive the network in an optimal manner.

There has thus been outlined, rather broadly, the features of the present disclosure in order that the detailed description may be better understood, and in order that the present contribution to the art may be better appreciated. There are additional features of the various embodiments that will be described herein. It is to be understood that the present disclosure is not limited to the details of construction and to the arrangements of the components set forth in the following description or illustrated in the drawings. Rather, the embodiments of the present disclosure may be capable of other implementations and configurations and may be practiced or carried out in various ways. Also, it is to be understood that the phraseology and terminology employed are for the purpose of description and should not be regarded as limiting.

As such, those skilled in the art will appreciate that the inventive conception, upon which this disclosure is based, may readily be utilized as a basis for the designing of other structures, methods, and systems for carrying out the several purposes described in the present disclosure. Those skilled in the art will understand that the embodiments may include various equivalent constructions insofar as they do not depart from the spirit and scope of the present invention. Additional aspects and advantages of the present disclosure will be apparent from the following detailed description of exemplary embodiments which are illustrated in the accompanying drawings.

Optimization System

FIG. 1 is a diagram illustrating an embodiment of a telecommunications network 10 having a plurality of autonomous systems (ASs) that are interconnected with each other. It should be noted that some telecommunications networks, such as the Internet, may include tens of thousands of ASs. However, in the simplified embodiment of FIG. 1, the telecommunications network 10 (e.g., a portion of the Internet) includes two Content Providers (CPs) 12, 14, a Regional Service Provider (RSP) 16, and a plurality of intermediate ASs 18, 20, 22, 24, 26, 28, 30, which may be configured as service providers. The two CPs 12, 14 (labelled AS-CP1 and AS-CP2) may be ASs that may be defined as sources of data packets that traverse the telecommunications network 10. Also, the RSP 16 (labelled AS-RSP) may also be an AS that may be defined as a destination for the data packets. From the AS-RSP 16, the data packets may be provided to a plurality of end users 32. The intermediate ASs 18, 20, 24, 26, 28, 30 are labelled AS1, AS2, AS3, AS4, AS5, AS6, and AS7. The autonomous systems (ASs) are configured to communicate with each other under the Border Gateway Protocol (BGP) or another Internet Protocol (IP).

According to one example, the two CP sources 12, 14 (i.e., AS-CP1 and AS-CP2) may include two news sources. The destination AS may have end users 32 that access the content provided by the CPs 12, 14.

The present disclosure relates to systems and methods for optimizing Border Gateway Protocol (BGP) traffic between one Autonomous System (AS) and another. For example, rules for controlling how data is exchanged between ASs can be established by Artificial Intelligence (AI) or Machine Learning (ML) techniques, such as Reinforcement Learning (RL). In many tests, it has been found that models created by RL typically outperform rules-based algorithms in BGP networks. Thus, it is believed that RL-based solutions will lead to true intent-based autonomous adaptive network and are an improvement over conventional rules-based systems.

RL agents can be added to the telecommunications network 10 to balance the BGP peering traffic using various RL techniques as described in the present disclosure. For optimal performance at the sources, the content providers AS-CP1 12 and AS-CP2 14 are capable of balancing the outgoing traffic. This balancing is already under the control of the content providers 12, 14, which provide the content at its output. Other upstream ASs within the telecommunications network 10 are also able to control the outbound (egress) traffic to their downstream neighbor. However, the ASs that are further downstream do not have control over how traffic is routed.

In the present disclosure, the RL agents added to or connected with each CP are able to change certain aspects of the received packets to potentially influence how the upstream ASs may route the packets. Thus, not only can the telecommunications network 10 be balanced from the perspective of the upstream ASs, but also, by using RL techniques, the downstream ASs can also be balanced as well. As a result, the telecommunications network 10 is able to operate more efficiently to maximize the end user experience and to minimize network anomalies such as latency and dropped packets.

For example, the AS that is the farthest downstream in the telecommunications network 10 is the Regional Service Provider (RSP) 16. Efficient operation may include balancing the incoming traffic from both the AS1 18 and the AS7 30, which, in this example, are the two ASs connected directly to the RSP 16. Since the RSP 16 does not have any direct control over how packets are routed, Reinforcement Learning (RL) agents may be distributed throughout the telecommunications network 10 for balancing the BGP (Border Gateway Protocol) traffic by routing some BGP traffic through AS1 18 and routing the remaining BGP traffic through AS7 30. Although it may seem apparent that the routing strategy from the first CP 12 (i.e., AS-CP1) to the RSP 16 may involve routing through AS3 22, AS2 20, and AS1 18, there may be circumstances when the routing strategy may be adjusted to route data packets from the AS-CP1 12 to the AS-RSP 16 via AS3 22, AS4 24, AS5 26, AS6 28, and AS7 30. The apparent routing strategy from the point of view of the content providers 12, 14 may be the shortest path. However, from the point of view of the AS-RSP 16, the routing strategies may provide better, more efficient results by modifications to these apparent best paths. Again, by incorporating the RL agents throughout the telecommunications network 10 for controlling outbound (egress) traffic, the RL agents can also performing certain functions to "influence" upstream neighbors to route BGP traffic based on a "bigger picture" strategy that can provide overall benefits to the entire network 10.

Figure 2:
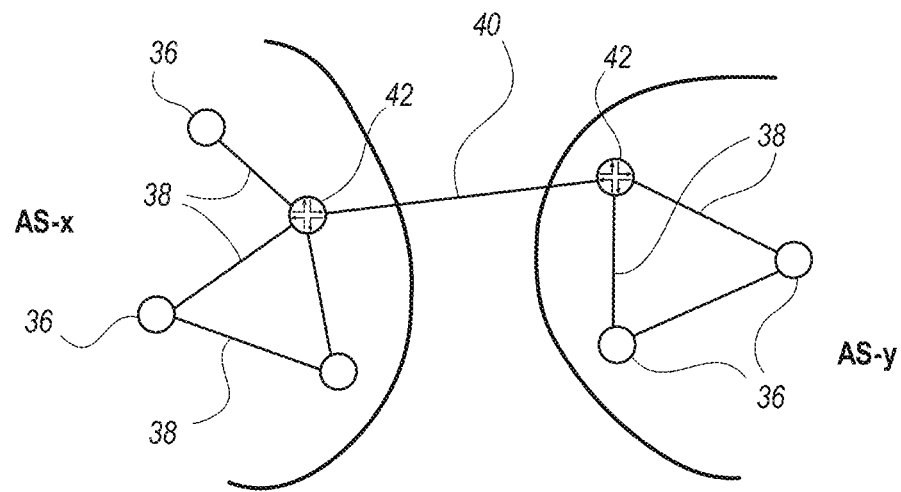
FIG. 2 is a diagram illustrating an inter-AS link between two neighboring ASs of the telecommunications network of FIG. 1, according to various embodiments.

FIG. 2 is a diagram illustrating a portion of the telecommunications network 10 to emphasize the connections within each autonomous system (AS) and connections from one AS to another. Only two neighboring ASs are shown in FIG. 2 for simplicity. Each of the ASs (e.g., AS-x and AS-y), includes a plurality of nodes 36, 42 (depicted as small circles). The nodes 36, 42 may be routers, switches, etc. Within each AS are a plurality of internal links 38 for connecting one node 36, 42 within an AS to another node 36, 42 within that same AS. In addition to the internal links 38, the telecommunication network 10 includes at least one inter-AS link 40 between each pair of neighboring ASs (e.g., AS-x and AS-y). Data packets from the content providers are routed through the internal links 38 and inter-AS links 40 via various ASs to the RSP 16. The inter-AP links 40 may be point-to-point interfaces, such as tunnels.

As mentioned above, the RL agents are provided throughout the telecommunications network 10 for controlling and influencing BGP traffic. For example, the RL agents may be connected to or incorporated in the nodes 42 that are configured to communicate to a neighboring AS through one of the inter-AS links 40. In the case of a corresponding node 42 configured to receive ingress data packets from an upstream neighbor via the inter-AS link 40, the RL agent may configure various parameters of this receiving node 42 to influence how the neighboring AS routes traffic. In some situations, this specific influence may result in an upstream AS modifying its routing strategy to give a higher preference to route BGP traffic through that downstream influencing AS or alternatively to dissuade the upstream AS from routing the BGP traffic through that downstream influencing AS and choosing a different path instead.

The present disclosure provides systems and methods of routing BGP traffic in order to optimize the traffic. Optimization of the BGP traffic may include the process of balancing the traffic on the inter-AS links 40. Referring again to FIG. 1, there are two inter-AS links 40 between the first CP 12 (i.e., AS-CP1) and AS3 22. Also, there are three inter-AS links 40 between the AS-RSP 16 and AS1 18 and AS7 30. By properly balancing the BGP traffic in an optimized manner, the experience of the end user 32 (e.g., Quality of Experience (QoE)) can be maximized and the service provider's costs to deliver the traffic can be minimized.

In the source-to-destination direction, an AS can directly choose which inter-AS link 40 to place traffic (when there is a choice) by using various controls ("knobs") in the nodes (e.g., routers) that are running BGP. Thus, direct control can be made in the outbound direction. However, this may not be the optimal choice from the destination AS's perspective (i.e., from the inbound direction). Although an AS may wish to have the ability to control how inbound traffic is received, the AS cannot directly control inbound traffic. However, according to the embodiments of the present disclosure, the systems and methods for optimizing BGP traffic may be able to indirectly "influence" how traffic is received in the inbound direction.

The indirect influence may include performing various functions to potentially influence the behavior of the neighboring upstream ASs for potentially steering traffic in the outbound direction from that neighboring AS. One solution to influencing inbound traffic is by utilizing Reinforcement Learning (RL) methodology to balance BGP traffic throughout the telecommunications network 10. RL algorithms running on RL agents through the network 10 are configured to automate the traffic balancing strategies to optimize the network 10. The RL agents described in the present disclosure have direct effects in the outbound direction and may include training and machine learning to influence how much traffic is shifted from one inter-AS link 40 to another, which is typically a difficult problem, if not impossible, in conventional systems.

The optimization system of the present disclosure uses methods based on Reinforcement Learning (RL) that are simpler to implement and more effective than traditional rules-based systems. RL-based AI have had success with optimizing the performance in different environments, including the playing of games (e.g., Go) and video games (e.g., Atari). This technology is utilized in the present disclosure so as to apply the RL methods to Internet Protocol (IP) networks using the BGP protocol. In some embodiments, the RL methodologies describe in the present disclosure may be incorporated into software products.

Optimization Goal

There is a per-bit monetary cost of sending or receiving traffic on inter-AS links 40. Some inter-AS links 40 may be free, while other links 40 may have a fixed cost or may be metered by the volume of traffic. One goal of the present disclosure is to minimize this cost. A second goal, for instance, is to optimize end-user experience, which is the reason why most service providers are in business. An optimized user experience is usually achieved by keeping the inter-AS links 40 uncongested, or below a certain utilization level. By controlling this utilization level, there will typically be a smaller delay between the source and the destination, as well as fewer packet drops. Although the optimization goal of the present disclosure may be defined as link utilization, other metrics (e.g., packet drops, direct delay, and jitter measurement of inter-AS links and paths) may also be optimized as well. The optimization functions described herein attempt to optimize both the cost objective as well as the utilization level objective. If these objectives conflict, the systems and methods of the present disclosure may be configured to rely on additional input (e.g., user input) for defining bounds within which to optimize. For example, an optimization goal may include finding the best user experience within a monetary budget.

Reinforcement Learning (RL) Agent

Figure 3:
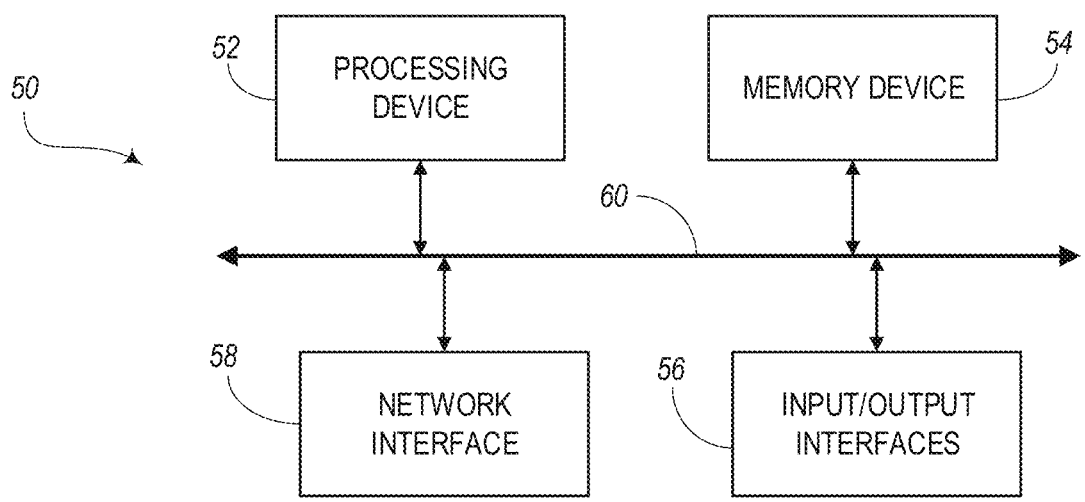
FIG. 3 is a block diagram illustrating a Reinforcement Learning (RL) agent for optimizing BGP traffic through a node of the telecommunications network of FIG. 1, according to various embodiments.

FIG. 3 is a block diagram illustrating an embodiment of a Reinforcement Learning (RL) agent 50 for optimizing BGP traffic through an Autonomous System (AS) of the telecommunications network 10 of FIG. 1. In the illustrated embodiment, the RE agent 50 may be a digital computer that, in terms of hardware architecture, generally includes a processing device 52, a memory device 54, input/output (I/O) interfaces 56, and a network interface 58. The memory device 54 may include a data store, database, or the like. It should be appreciated by those of ordinary skill in the art that FIG. 3 depicts the RL agent 50 in a simplified manner, where practical embodiments may include additional components and suitably configured processing logic to support known or conventional operating features that are not described in detail herein. The components (i.e., 52, 54, 56, 58) are communicatively coupled via a local interface 60. The local interface 60 may be, for example, but not limited to, one or more buses or other wired or wireless connections. The local interface 60 may have additional elements, which are omitted for simplicity, such as controllers, buffers, caches, drivers, repeaters, receivers, among other elements, to enable communications. Further, the local interface 60 may include address, control, and/or data connections to enable appropriate communications among the components 52, 54, 56, 58.

The processing device 52 is a hardware device adapted for at least executing software instructions. The processing device 52 may be any custom made or commercially available processor, a central processing unit (CPU), an auxiliary processor among several processors associated with the RL agent 50, a semiconductor-based microprocessor (in the form of a microchip or chip set), or generally any device for executing software instructions. When the RL agent 50 is in operation, the processing device 52 may be configured to execute software stored within the memory device 54, to communicate data to and from the memory device 54, and to generally control operations of the RL agent 50 pursuant to the software instructions.

It will be appreciated that some embodiments of the processing device 52 described herein may include one or more generic or specialized processors (e.g., microprocessors, Central Processing Units (CPUs), Digital Signal Processors (DSPs), Network Processors (NPs), Network Processing Units (NPUs), Graphics Processing Units (GPUs), Field Programmable Gate Arrays (FPGAs), and the like). The processing device 52 may also include unique stored program instructions (including both software and firmware) for control thereof to implement, in conjunction with certain non-processor circuits, some, most, or all of the functions of the methods and/or systems described herein. Alternatively, some or all functions may be implemented by a state machine that has no stored program instructions, or in one or more Application Specific Integrated Circuits (ASICs), in which each function or some combinations of certain of the functions are implemented as custom logic or circuitry. Of course, a combination of the aforementioned approaches may be used. For some of the embodiments described herein, a corresponding device in hardware and optionally with software, firmware, and a combination thereof can be referred to as "circuitry or logic" that is "configured to or adapted to" perform a set of operations, steps, methods, processes, algorithms, functions, techniques, etc., on digital and/or analog signals as described herein for the various embodiments.

The I/O interfaces 56 may be used to receive user input from and/or for providing system output to one or more devices or components. User input may be provided via, for example, a keyboard, touchpad, a mouse, and/or other input receiving devices. The system output may be provided via a display device, monitor, graphical user interface (GUI), a printer, and/or other user output devices. I/O interfaces 56 may include, for example, a serial port, a parallel port, a small computer system interface (SCSI), a serial ATA (SATA), a fiber channel, InfiniBand, iSCSI, a PCI Express interface (PCI-x), an infrared (IR) interface, a radio frequency (RF) interface, and/or a universal serial bus (USB) interface.

The network interface 58 may be used to enable the RL agent 50 to communicate over a network, such as the telecommunications network 10, the Internet, a wide area network (WAN), a local area network (LAN), and the like. The network interface 58 may include, for example, an Ethernet card or adapter (e.g., 10 BaseT, Fast Ethernet, Gigabit Ethernet, 10 GbE) or a wireless local area network (WLAN) card or adapter (e.g., 802.11a/b/g/n/ac). The network interface 58 may include address, control, and/or data connections to enable appropriate communications on the telecommunications network 10.

The memory device 54 may include volatile memory elements (e.g., random access memory (RAM, such as DRAM, SRAM, SDRAM, and the like)), nonvolatile memory elements (e.g., ROM, hard drive, tape, CDROM, and the like), and combinations thereof. Moreover, the memory device 54 may incorporate electronic, magnetic, optical, and/or other types of storage media. The memory device 54 may have a distributed architecture, where various components are situated remotely from one another, but can be accessed by the processing device 52. The software in memory device 54 may include one or more software programs, each of which may include an ordered listing of executable instructions for implementing logical functions. The software in the memory device 54 may also include a suitable operating system (O/S) and one or more computer programs. The operating system (O/S) essentially controls the execution of other computer programs, and provides scheduling, input-output control, file and data management, memory management, and communication control and related services. The computer programs may be configured to implement the various processes, algorithms, methods, techniques, etc. described herein.

The memory device 54 may include a data store used to store data. In one example, the data store may be located internal to the RL agent 50 and may include, for example, an internal hard drive connected to the local interface 60 in the RL agent 50. Additionally, in another embodiment, the data store may be located external to the RL agent 50 and may include, for example, an external hard drive connected to the I/O interfaces 56 (e.g., SCSI or USB connection). In a further embodiment, the data store may be connected to the RL agent 50 through a network and may include, for example, a network attached file server.

Moreover, some embodiments may include a non-transitory computer-readable storage medium having computer readable code stored in the memory device 54 for programming the RL agent 50 or other processor-equipped computer, server, appliance, device, circuit, etc., to perform functions as described herein. Examples of such non-transitory computer-readable storage mediums include, but are not limited to, a hard disk, an optical storage device, a magnetic storage device, a ROM (Read Only Memory), a PROM (Programmable Read Only Memory), an EPROM (Erasable Programmable Read Only Memory), an EEPROM (Electrically Erasable Programmable Read Only Memory), Flash memory, and the like. When stored in the non-transitory computer-readable medium, software can include instructions executable by the processing device 52 that, in response to such execution, cause the processing device 52 to perform a set of operations, steps, methods, processes, algorithms, functions, techniques, etc. as described herein for the various embodiments.

Actions

The RL agent 50 may be configured to perform certain direct actions for controlling the egress BGP traffic in the outbound direction. One step for controlling output may include: (1) setting local-preferences of BGP routes, which will cause all traffic destined to this route's prefix to exit at this route's next-hop, on the inter-AS link 40. Another step may include: (2) segment routing egress traffic engineering, which can be used to steer exiting traffic over a segment routing tunnel to a particular inter-AS link 40.

In addition, the RL agent 50 is also configured to perform certain "indirect" actions for "influencing" the ingress BGP traffic in the inbound direction. One process for influencing inbound traffic may include allowing the AS to inject into the BGP a more specific prefix route on select inter-AS links 40. In BGP, more specific routes are generally preferred over less specific routes. The prefix route injected in the BGP may be broadcast to other ASs. By injecting a more specific prefix route, this indirect action may cause a shift in the BGP traffic destined to the more specific prefix, essentially selecting a specific inter-AS link 40. However, some ASs may filter the specific prefix broadcast, although some may allow it. The effect may be uncertain. However, the RL agent 50 may be configured to conduct an RL algorithm to handle this uncertainty and make additional modifications as needed.

The RL agent 50 may include another process for influencing inbound traffic. For example, each BGP route includes an AS path attribute that tracks how that route reaches its destination across the AS topology. An AS can artificially prepend its AS number one or more times to the AS path of the select BGP routes on select inter-AS links 40. As BGP prefers routes with shorter AS paths, this prepending strategy will give the appearance that these routes are longer and would make the routes over these inter-AS links 40 to be less desirable. Depending on how many times the AS number is artificially prepended, the effect on the actual routing may vary. As more and more AS numbers are prepended, the more likely the ASs in the network will shift their preferred route. In the optimum solution, it may be desirable not to shift all the BGP traffic. However, with the learning processes of the RL agents 50 deployed throughout the network 10, attempts at prepending different AS numbers may result in different outcomes that can essentially be optimized by the RL agents 50.

According to yet another process for influencing inbound traffic, the RL agent 50 may be configured to perform other functions. For example, an autonomous system (AS) may use different multi-exit discriminator (MED) attribute values for BGP routes announced on different inter-AS links 40. These attribute values, if honored by the neighbor AS, will shift the traffic to inter-AS links 40 with lower MED values. Its effect may be limited to the neighbor AS only.

The RL agents 50 may be configured to perform still another process for influencing inbound traffic, as follows. Some ASs may want other ASs to influence their routing decisions. For this purpose, they may publish a list of BGP communities, which may have only a few variations. The RL agent 50 may be configured to work with any of these variations of the BGP communities and consider the various routing preferences of the communities. In this case, an AS can announce routes with different community values on different inter-AS links 40 and cause the remote AS to change its route selection. For example, with reference to FIG. 1, AS3 22 may prefer routes with 4:1 community over routes with 4:2 community. The AS-RSP 16 can announce routes with 4:1 on the AS1 18 peering links and 4:2 on the AS7 30 peering links. This may cause AS3 22 to reverse its routing decision and prefer the longer AS4, AS5, AS6, AS7, AS-RSP path over the default route AS3, AS2, AS1, AS-RSP path, which although may be shorter, may otherwise be more congested.

Components of the RL Agent

Figure 4:
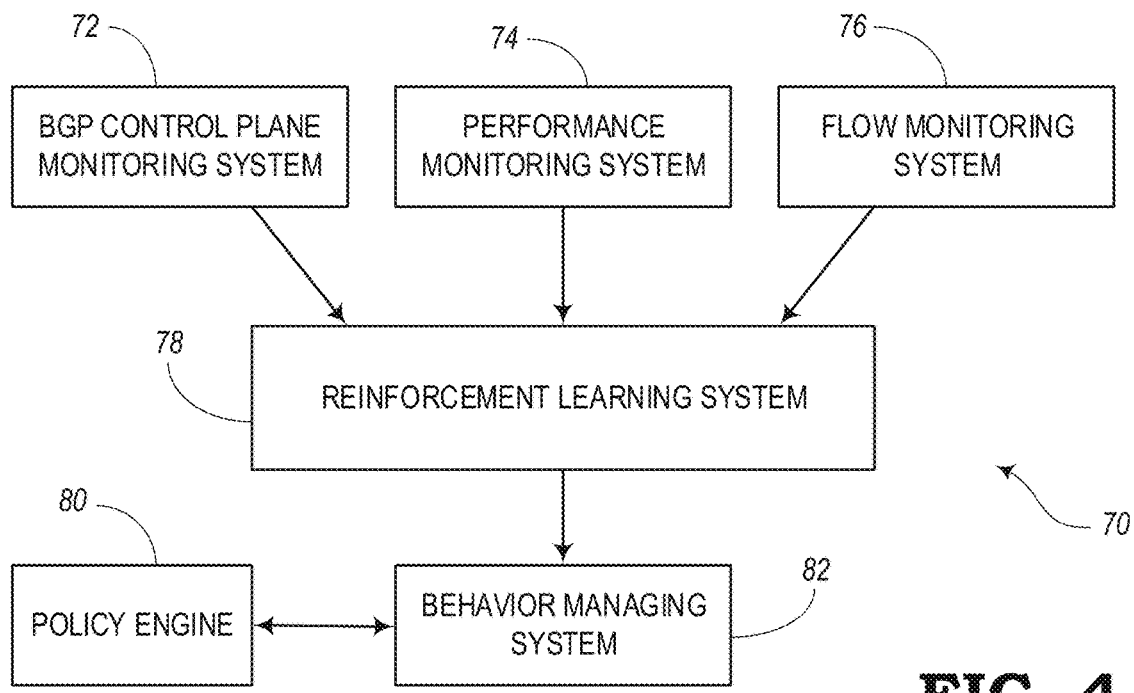
FIG. 4 is a block diagram illustrating an optimization system for optimizing BGP traffic with assistance from the RL agent of FIG. 3, according to various embodiments.

FIG. 4 is a block diagram illustrating an embodiment of an RL system 70 for optimizing BGP traffic utilizing the RL agent 50 of FIG. 3. The RL system 70 may include multiple components that may be included in the RL agent 50, and vice versa. In some embodiments, the RL system 70 may include software, firmware, and/or hardware incorporated into or running on the RL agent 50 for performing the various functions described herein.

As shown in FIG. 4, the RL system 70 includes a BGP control plane monitoring system 72, a performance monitoring system 74, and a flow monitoring system 76 for monitoring different aspects of the telecommunications network 10. The monitored results are provided to an orchestration system 78, which utilizes the monitored parameters to determine one or more of the above-mentioned actions. These actions from the orchestration system 78, along with instructions from a policy engine 80, are communicated to a behavior managing system 82, which is configured to take certain direct or indirect actions to control or influence BGP traffic flow in either the upstream or downstream direction.

The BGP control plane monitoring system 72 may be configured to monitor in real-time all the inter-AS paths available between the source (e.g., AS-CP1 12 or AS-CP2 14) and destination (e.g., AS-RSP 16). The BGP control plane, in this example, may be part of a routing architecture that is concerned with defining the network topology to determine how to handle incoming data packets, in some embodiments, a routing table (e.g., stored in the memory device 54) may contain a list of destination addresses and the outbound inter-AS links 40 used to define various routing techniques. The BGP control plane monitoring system 72 may further be configured to give preferred treatment to certain data packets that meet a higher QoE level.

The performance monitoring system 74 may be configured similarly to the Blue Planet Performance Explorer program and may be configured to monitor the performance of the inter-AS links 40 and other paths in real-time.

Performance metrics may include link utilization, packet drops, delay, and jitter of the inter-AS links 40 and paths.

The flow monitoring system 76 may be configured to receive flow data from the devices on the telecommunications network 10 and determine what source-destination traffic is flowing on which inter-AS link 40. Also, the flow monitoring system 76 is configured to monitor the volume of traffic at these various points.

The orchestration system 78 may be an orchestrator and/or a Software Defined Networking (SDN) controller. The orchestration system 78 may be configured to operate in conjunction with the policy engine 80. The orchestration system 78 may be able to react to an imbalance in the telecommunications network 10, as well as provision direct and indirect actions, such as those mentioned above, on BGP routers. Again, the "direct" actions may be defined as those for controlling outbound traffic flow and "indirect" actions may be defined as those for influencing inbound traffic flow. The inbound and/or outbound traffic can be directly or indirectly controlled/influenced by the orchestration system 78.

The behavior managing system 82 receives instructions from the orchestration system 78 and policy instructions from the policy engine 80. The behavior managing system 82 may include be a deep reinforcement learning AI system. The behavior managing system 82 analyzes the performance metrics to decide whether the optimization goal is achieved. If not, the behavior managing system 82 determines whether to apply a direct or an indirect action to shift traffic from one inter-AS link 40 to another. The behavior managing system 82 may use the flow data from the flow monitoring system 76 to decide what traffic to shift to another link. It may use information from the BGP control plane monitoring system 72 to decide how to achieve this intended traffic routing modification. Also, the behavior managing system 82 may use information from the orchestration system 78 to implement actions in the telecommunications network 10.

Figure 5:
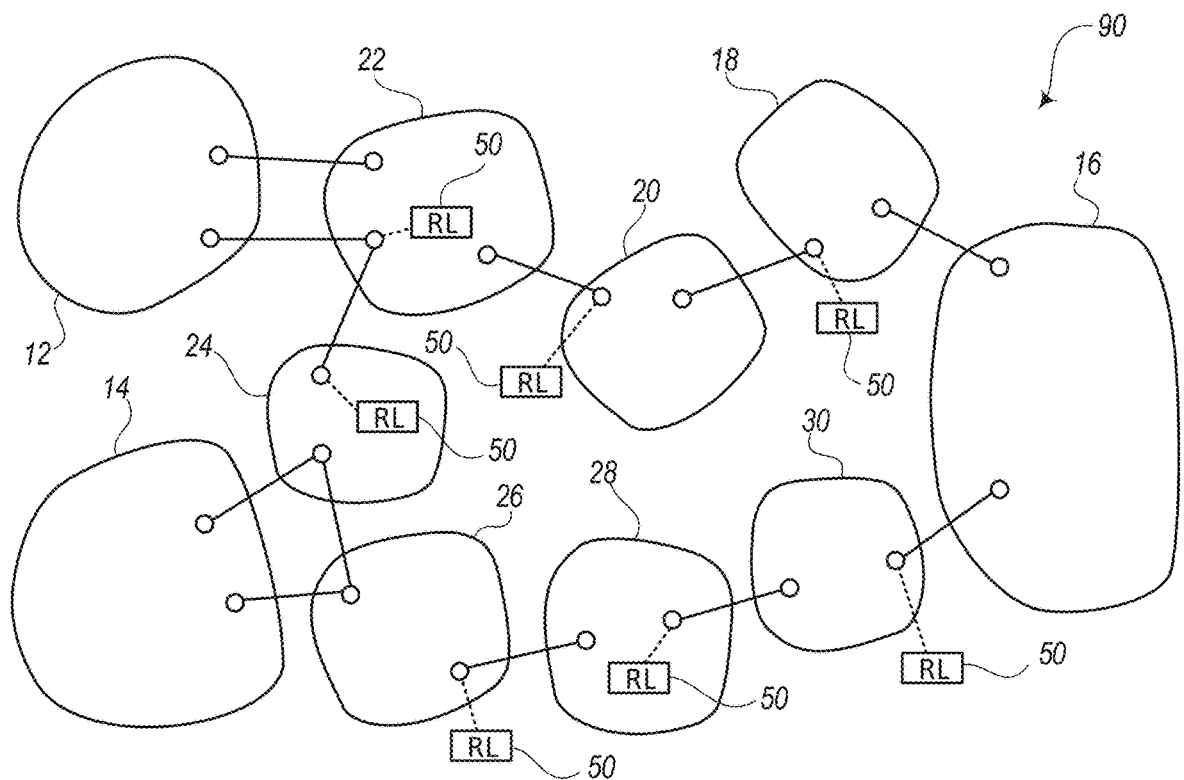
FIG. 5 is a diagram illustrating an optimization system for use with the telecommunications network of FIG. 1, whereby RL agents, such as the RL agents of FIG. 3, are connected to the ASs of the telecommunications network for optimizing the BGP traffic throughout the network, according to various embodiments.

FIG. 5 is a diagram showing an embodiment of the telecommunications network 10 configured with an optimization system 90 (e.g., the optimization system 70 of FIG. 4) for optimizing traffic routing. The optimization system 90 may utilize a plurality of RL agents 50 (e.g., including components of the optimization system 70 described with respect to FIG. 4). The RL agents 50 may be connected to the ASs 18, 20, 22, 24, 26, 28, 30 of the telecommunications network 10 for optimizing the BGP traffic throughout the network 10 and/or may be incorporated within the ASs themselves or incorporated into one or more of the border routing nodes 42 within the ASs.

The optimization system 90 operates within the framework of a RL loop as follows. The RL agents 50 of the RL-based system are able to influence and optimize BGP peering in near-real time. In particular, a "state" of the RL loop can be characterized by: (1) ingress traffic at each BGP inter-AS link; (2) performance metrics for each inter-AS link 40 (e.g. latency, dropped packets, etc.); (3) statistics about past changes (flapping estimator); and (4) business metrics, which may include, for example, (a) SLA of each BGP service, (b) cost per bit of traffic for each inter-AS link, and (c) external data sources (e.g. special events requiring the handling of specific routing).

The "actions" of the RL loop are listed above and may include direct actions and indirect actions. The direct actions include controlling the egress or outbound traffic flow. The indirect actions including the multiple ways of "influencing"

other upstream ASs as mentioned above to shift traffic as needed to essentially obtain a more optimized network with a balanced data flow.

In the RL loop, "rewards" can be provided to the RL agent 50 to reinforce any positive actions that result in better network performance. These rewards, similar to optimizing the chances of winning a game in game theory analysis, can result in a balanced network flow. Some of the rewards may include: (1) maximizing the balance of weighted traffic among all possible inter-AS links; (2) maximize the QoE (e.g., by minimizing dropped packets and by avoiding congestion); (3) minimizing SLA penalties; (4) minimizing cost per bit; (5) minimizing latency; (6) minimizing the penalty to change routing data (e.g., by using a regulator for reducing port/route flapping caused by instability in the network or too frequent changes); and (7) some weighted combination of the rewards (1-6) above, where the weights may be tuned by network operators, depending on their requirements.

RL System

Figure 6:
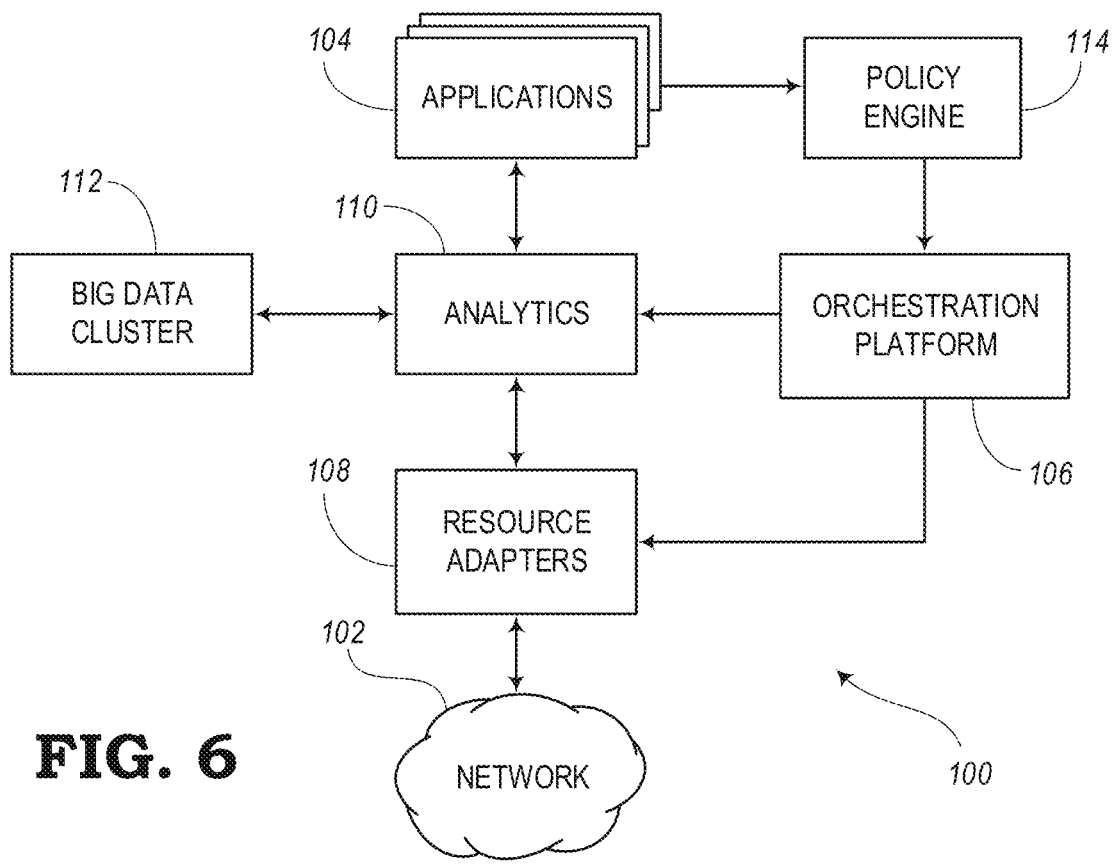
FIG. 6 is a block diagram of an RL system communicatively coupled to the telecommunications network of FIG. 1 for influencing the BGP traffic, according to various embodiments.

FIG. 6 is a block diagram of an embodiment of an RL system 100 communicatively coupled to a network 102, such as the telecommunications network 10 or another network. The RL system 100 is configured for controlling and/or influencing the BGP traffic. Similar to the embodiments mentioned above, the RL system 100 is configured to leverage the concept of Reinforcement Learning (RL) to enable self-driving autonomous networks. With the RL system 100, software applications 104 can learn when and how to perform actions on network elements (e.g., Autonomous Systems (ASs) or nodes 36 of the ASs) in the network 102 in order to reach an optimal state.

The RL system 100 includes an orchestration (or control) platform 106, which communicates to the network 102 via Resource Adapters (RAs) 108. The orchestration/controller platform 106 can be part of a Network Management System (NMS) or platform. The NMS platform can be an open and vendor-agnostic software application that allows for rapid creation, deployment, and automation of the end-to-end delivery of services across both physical and virtual networks. The RL system 100 further includes analytics 110 which can provide input data telemetry (e.g., Performance Monitoring (PM) data, statistics, etc.), a big data cluster 112 for data storage and processing, and a policy engine 114.

The telemetry is performed by custom Resource Adapters (RA) 108 that know how to communicate with the network devices in the network 102 and is complemented by data acquisition software located in the Network Management System (e.g., orchestration platform 106) and/or the Analytics platform 110. The data storage and processing can occur in the big data cluster 112 and is driven by instructions from the applications 104. The applications 104 are where all the RL analysis is performed. The applications 104 generate the Machine Learning (ML) insights about the state of the network 102. Finally, the policy engine 114 can be programmed to execute actions on the SDN-aware devices via the controller or the orchestrator 106.

The network 102 can operate at Layer 0 (photonic, Dense Wave Division Multiplexing (DWDM), Layer 1 (Time Division Multiplexing (TDM) such as Optical Transport Network (OTN), Layer 2 (Ethernet, Multiprotocol Label Switching (MPLS), etc.), Layer 3 (Internet Protocol), and the like. The network 102 can be formed via network elements or nodes which can be configured to provide services at the various Layers. In one embodiment, the network elements can be nodal devices that may consolidate the functionality of a multi-service provisioning platform (MSPP), digital cross-connect (DCS), Ethernet and Optical Transport Network (OTN) switch, DWDM platform, etc. into a single, high-capacity intelligent switching system providing Layer 0, 1, 2, and/or 3 consolidation. In another embodiment, the network elements can be any of add/drop multiplexers (ADMs), multi-service provisioning platforms (MSPP), digital cross-connects (DCSs), optical cross-connects, optical switches, routers, switches, WDM terminals, access/aggregation devices, etc. That is, the network elements can be any systems with ingress and egress signals and switching of packets, channels, timeslots, tributary units, wavelengths, etc.

As can be noticed in FIG. 6, the RL system 100 forms a "closed loop" in which the telemetry data is pulled from the network devices (network elements) and analyzed by the applications 104 at regular intervals (e.g., every minute), on demand, at varying frequencies, etc. The result of each analysis can trigger an action on the network 102, or not, depending on the situation. As is described herein, an action includes a configuration in the network 102, in the network elements, etc., to perform some function.

In various embodiments, RL includes defining costs and rewards to quantify network actions, determining allowed network actions, and defining metrics describing a state of the network 100. Steps of an RL method may include obtaining network data to determine a current state based on the defined metrics and determining one or more of the network actions, which may be based on the current state, based on minimizing the costs, and/or maximizing the rewards. That is, RL includes rewards/costs which set the objective/goal, a state which defines where the network 100 currently is relative to the objective/goal, and network actions which are used to drive the state towards the objective/goal.

Reinforcement Learning

Figure 7:
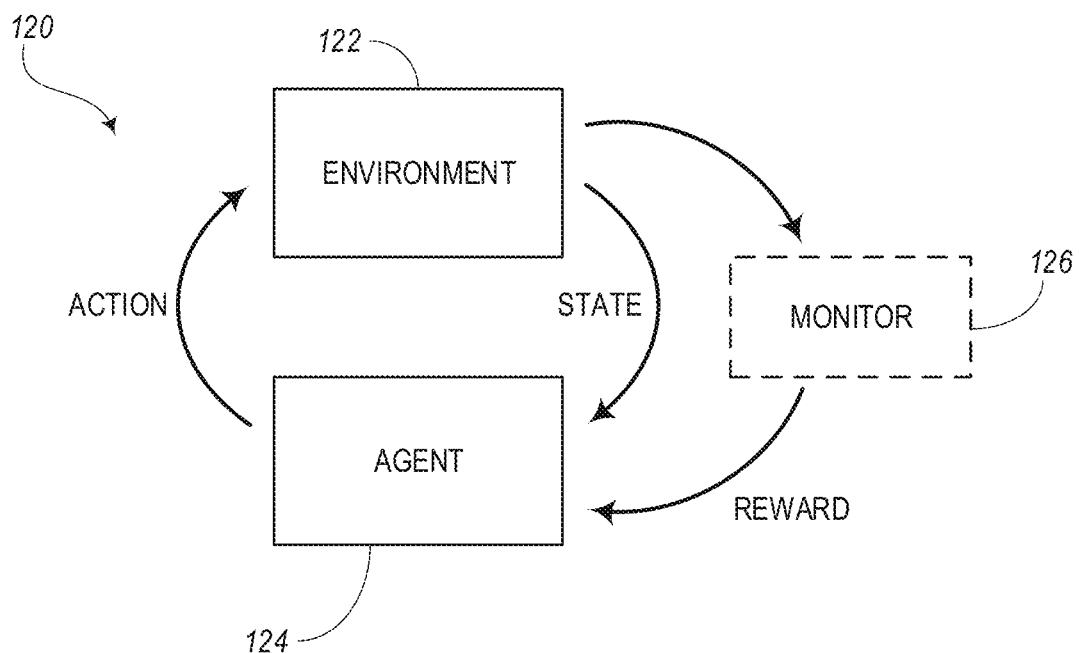
FIG. 7 is a block diagram illustrating a generalized RL process according to various embodiments.

FIG. 7 is a block diagram illustrating a generalized RL process 120. Reinforcement learning includes seeking to learn what to do given a problem (e.g., an optimal mapping from its current "STATE" to some "ACTION") so as to maximize the "REWARD" signal in the long run. Frequently, the applications 104 do not have any a priori knowledge of its environment 122 and must discover which actions yield the most reward for an agent 124 subjected to the environment 122 by trying out various combinations of actions, states, and rewards. This leads to the trade-off between exploration (i.e., trying new things) and exploitation (i.e., using previous knowledge). The applications 104 (e.g., monitor 126 for monitoring the environment 122) must exploit what it already knows in order to obtain rewards, but also needs to explore in order to make better actions in the future.

The monitor 126 (e.g., application 104) implements reinforcement level algorithms applied to the networking space. At the high level, as documented in (1) Ian Goodfellow et al, "Deep Learning", available online at www.deeplearningbook.org, and (2) David Silver et al., "Mastering the game of Go without human knowledge," Nature 550.7676 (2017): 354, the contents of each reference being incorporated herein by reference, these processes require a cost function, a parametrization of the network state, and a list of possible actions.

At each iteration of the closed-loop of the RL process 120, the state of the network "s" or environment 122 is determined from the telemetry data. The monitor 126 (e.g., application 104) determines a value of the reward "r(s)" (also referred to as "cost") associated with that state. Then, the RL process 120 determines the action "a" that can be taken on the network in order to bring it to the next state "s'," which is expected to get a better or equal reward r(s'). Note that "doing nothing" may also be considered a valid action. When a new state is detected, the process 120 updates the value Q(s, a) as follows:

$$Q(s, a) \to (1 - \alpha)Q(a, s) + \alpha(r + \gamma \max_{a'} Q(s', a'))$$

After several iterations, the map of Q(s, a) becomes an accurate description of the network states and their possible best actions. Parameter α determines the relative weight of newer states with respect to older ones. This configures how quickly the RL can adapt to changing conditions versus how much it will remember its lessons from the past when getting to choose an action. A valid action "a" in a given state "s" is chosen with probability according to the Boltzmann Distribution:

$$\frac{e^{Q(s,a)/T}}{\sum_{a'} e^{Q(s,a')/T}}$$

The choice of hyper-parameter T can be varied depending on how much exploration is desired versus exploiting the greedy action. It is best practice to start with a large T, allowing different actions to be chosen. As T tends to 0, the RL process 120 moves toward choosing the best possible action.

The RL process 120 of FIG. 7 may include multiple time steps or repetitions to achieve a desired outcome. At each time step t, the applications 104 select an action $A_t$ provided its current state $S_t$. The choice of action by the agent 124 will move the applications 104 to the next state $S_{t+1}$ and more importantly, provide a numerical reward $R_{t+1}$. The goal is to determine a policy, analyzed by the monitor 126, which is a mapping from states to actions, which maximizes the reward it receives in the long run.

In some embodiments, the RL process 120 may be applied in the network 102 to Labeled Switched Path (LSP) tunnel traffic/allocation profiles. In one embodiment, the RL process 120 can be used to set the traffic/allocation profiles of LSP tunnels in an MPLS network. A label-switched path (LSP) is a unidirectional path through the MPLS network. An LSP can be established via any signaling protocols such as Label Distribution Protocol (LDP), Resource Reservation Protocol (RSVP), or Border Gateway Protocol (BGP). LSPs are established by the network operator for a variety of purposes, such as to create network-based IP virtual private networks or to route traffic along specified paths through the network.

In various embodiments, the State (S) describes the current LSP tunnel traffic or allocation profiles: i.e., (1G, 5G, 2G)/(2G, 4G, 2G). The Action (A) modifies the allocation profile for the tunnels and moves the network 102 to the next state, such as Increase/Decrease tunnel allocations (or "do nothing"), i.e., (1G, 5G, 2G)/(2G, 4G, 2G)→(1G, 5G, 2G)/ (1G, 5G, 2G).

A "priority" describes the relative priority of traffic for each tunnel, i.e., (5, 5, 5)→each tunnel has priority 5 (uniformly treated), and, i.e., (1, 5, 10)→the third tunnel is given highest priority (at the expense of others). The Reward/Cost (R) may be proportional to the number of dropped packets and the corresponding priority, i.e., dropped_traffic·priority. A Policy(π) maps a particular state to an action.

π:S→A

Often times the environment and rewards are known, whether it is pre-defined or estimated via sampling (exploration). In the case where the next state is only conditioned on the current state, one can formulate the problem as a finite Markov Decision Process. The dynamics of a finite MDP are defined by its state and actions sets, and the one-step transition probabilities:

$$Pr\{S_{t+1}=s', R_{t+1}=r | S_t=s, A_t=a\}$$

For example, the objective is to maximize (or minimize) the total discounted accumulated reward for each time step $$G_t = R_{t+1} + \gamma R_{t+2} + \gamma^2 R_{t+3} + \cdots = \sum_{k=0}^{\infty} \gamma^k R_{t+k+1}$$

At any time step t, the goal is to maximize expected cumulative rewards going forward. Adding a discount factor 0<γ<1 guarantees convergence and also provides intuition about the interplay between short and long-term goals.

This can be generalized for each state via a value function given some policy π as follows:

$$v_\pi(s) = E_\pi[G_t | S_t = s]$$

The value function is also known as Bellman's equation, which can be solved using the Decision Process (DP) techniques (optimal control), Value iteration, Policy Iteration, etc. The following is an example of an RL process: Imagine eating a piece of cake; the optimal action would be to take another bite (to receive a good feeling signal) if gamma is small. But if gamma is large, the negative long-term consequences weigh more, and one would stop eating in order to avoid the negative consequences.

Thus, it is desired to find the optimal policy which maximizes the value of each state:

$$v_*(s) = \max_\pi v_\pi(s) \forall s \in S$$

This can be a model-free reinforcement learning technique. The applications 104 have no idea of its environment dynamics and learns at each step. The applications 104 heavily rely on exploration at the beginning in order to visit as many different states as possible and can adapt to changing environments which in turn creates optimal policies. For any finite MDP (Markov Decision Process), Q-learning eventually finds an optimal policy:

$$Q(s, a) \to (1 - \alpha)Q(s, a) + \alpha(r + \gamma \max_{a'} Q(s', a'))$$

RL Training

As with all machine learning, the RL process 120 requires training. In this case, the learning provides increasingly accurate modeling of the network states and its mapping to optimal actions. In a Greenfield deployment (new network), the operator can first let the network operate with controlled traffic and without real customer traffic to let the RL learn by trial and errors in situ. If this is not possible, the RL process 120 can learn from historical data using an imitation learning strategy. Alternatively, if available, the RL process 120 can be trained using a network simulator.

User APIs

The users of the applications 104 may be network operators. The applications 104 expose Application Programming Interfaces (APIs) that enable the user to define custom cost or reward functions, to specify a list of allowed actions that can be performed on the SDN-aware network elements, and a list input metrics that characterize the network state.

In the above, the decisions to take specific actions for influencing BGP traffic are made by a deep reinforcement learning AI system. The following describes how the AI can learn what actions are effective under which circumstances.

The RL process 120 and related systems rely on State, Actions, and Reward. The RL process 120 learns a Policy indicating what is the best action to take for each possible state in order to maximize the long-term reward. Policy learning can be performed online or offline and depends on a few hyper-parameters, such as the balance between exploitation and exploration. This process can be described as "learning by trial and error" or "training."

Determination of Optimal State-to-Action Policies

FIGS. 8-12 include various strategies for operating a RL process for optimizing a BGP network. After enough training, RL-based policies are expected to outperform rules-based policies determined from domain expertise, especially in a complex environment like BGP networks (e.g., telecommunications network 10, network 102, etc.). Furthermore, with online learning, the policy itself can continue to evolve and adapt to a changing environment.

Figure 8:
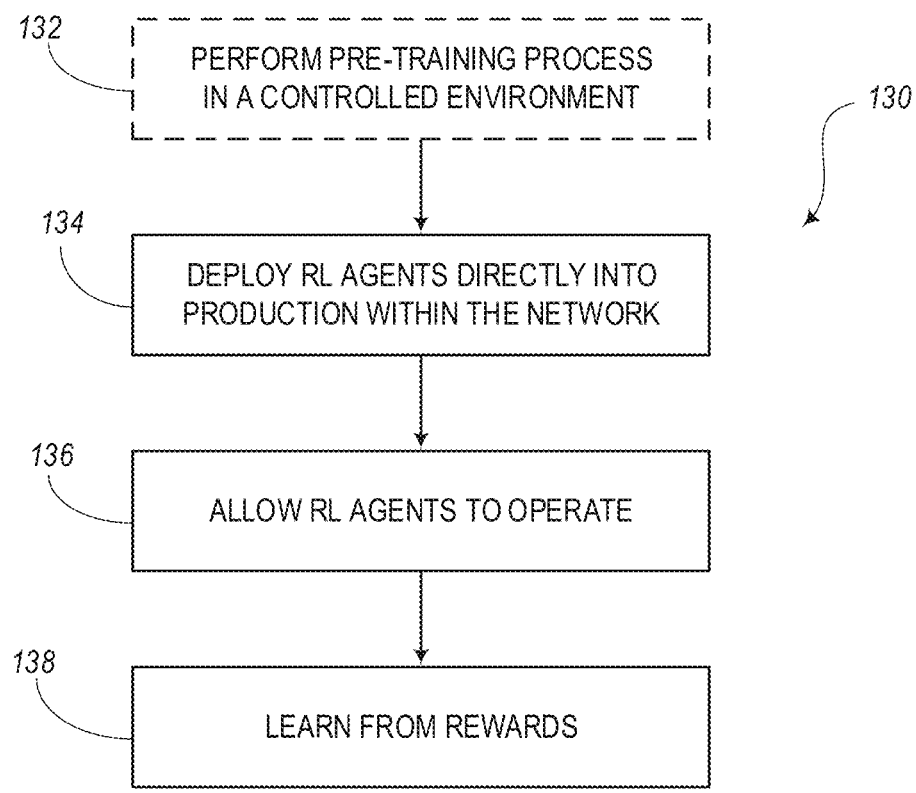
FIG. 8 is a flow diagram illustrating a method for training the RL agent of FIG. 3, according to various embodiments.

FIG. 8 is a flow diagram illustrating an embodiment of a method 130 for training the RL agent 50 of FIG. 3. This method 130 may represent a simple way of training the AI of the RL agent 50. In some embodiments, the method 130 may optionally include one or more pre-training processes. For instance, a first set of steps, as indicated in block 132, may include performing one or more pre-training processes in a controlled environment. Various pre-training processes are described below with respect to FIGS. 9 and 10.

After any pre-training steps, the method 130 provides a step, indicated in block 134, of deploying RL agents (e.g., RL agents 50) directly into production within the network (e.g., deployed as illustrated in FIG. 5). The method 130 also includes allowing the RL agents to operate for a certain amount of time by taking certain actions, as indicated in block 136. The method 130 also includes the step of learning from the rewards in the RL process, as indicated in block 138. In other words, with direct introduction into the network, the method 130 may represent a pure in situ learning type of process. To minimize risks, however, the production environment can be protected with a Safeguard system for safeguarding an AI-based network controller.

An obstacle to pure in situ learning, however, happens in the early phase of learning, when the AI has not yet received enough training. In the extreme case, such an AI could recommend random actions, which is generally not allowed in a production network. A solution to this problem may be to perform the pre-training processes in a controlled environment, as described in block 132, before deploying RL-based AI (or RL agents) in production (block 134). The pre-training processes of block 132 may also be referred to as "transfer learning." Pre-training methods are described below with respect to FIGS. 9 and 10.

Figure 9:
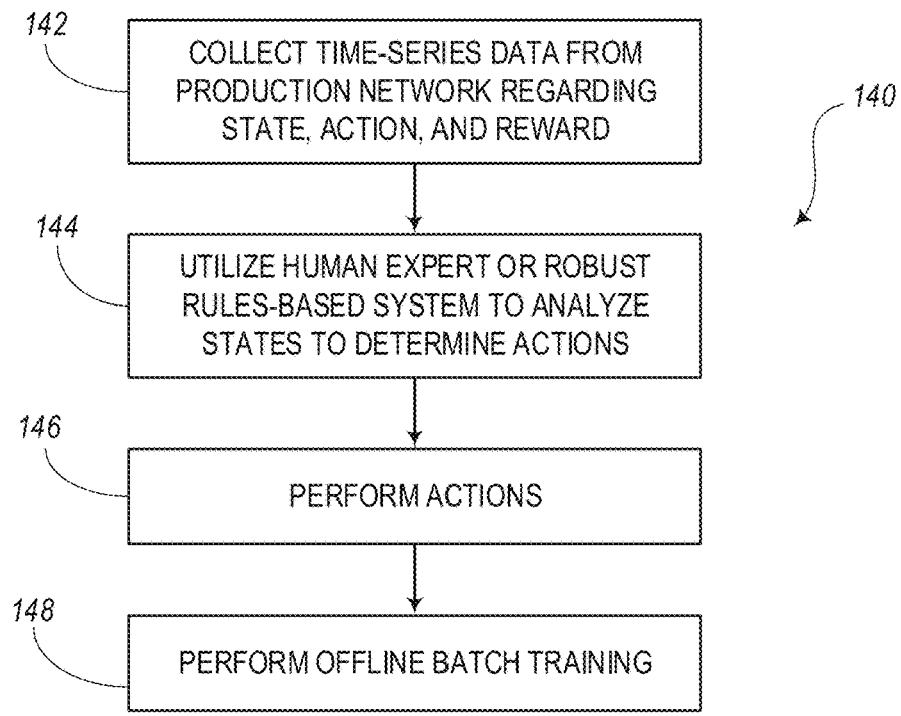
FIG. 9 is a flow diagram illustrating a first method for performing a pre-training process to be conducted prior to the method of FIG. 8 for pre-training the RL agent of FIG. 3, according to various embodiments.

FIG. 9 is a flow diagram illustrating an embodiment of a method 140 for performing a first pre-training process to be conducted prior to deployment of RL agents described in the method 130 of FIG. 8. For example, the method 140 may be executed for pre-training RL agents, such as the RL agents 50 of FIG. 3 or the RL systems 70 of FIG. 4.

The first pre-training process of FIG. 9 includes collecting time-series data from a production network regarding state, action, and reward information, as indicated in block 142. The method 140 may also include utilizing a human expert or a robust rules-based system to analyze states to determine actions, as indicated in block 144. It should be noted that an NMS platform may already be capable of collecting necessary information about state and reward for enabling the analysis of states and actions. In some embodiments, the NMS platform may be extended in this regard to allow the program to collect information about actions to enable this step (block 144). Also, a step (block 146) may include performing actions determined from the human expert or rules-based system. The method 140 also include performing an offline "batch" training of the RL-based AI using this data, as indicated in block 148.

Figure 10:
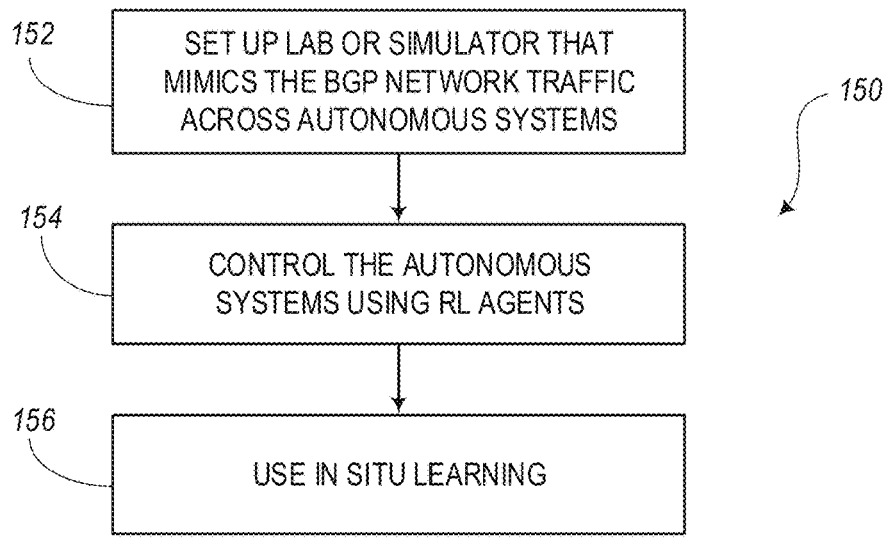
FIG. 10 is a flow diagram illustrating a second method for performing a pre-training process to be conducted prior to the method of FIG. 8 for pre-training the RL agent of FIG. 3, according to various embodiments.

FIG. 10 is a flow diagram illustrating an embodiment of another method 150 for performing a pre-training process to be conducted prior to the method of FIG. 8 for pre-training the RL agent. This method 150 may include setting up a lab or simulator that mimics the BGP network traffic across autonomous systems (ASs), as indicated in block 152. The method 150 then includes allowing one or more RL agents to control the ASs, as indicated in block 154. At this point, the process may include falling back into in situ learning, as indicated in block 156, where the in situ learning may be performed in a safe environment before deployment into the target network. This can be effective if the lab or simulator is sufficiently similar to the production environment. However, in the case of BGP peering, it may be difficult to mimic the fact that it is not just one isolated AS influencing traffic, but also other ASs are actively influencing the BGP traffic of the network as well.

Figures 11, 12:
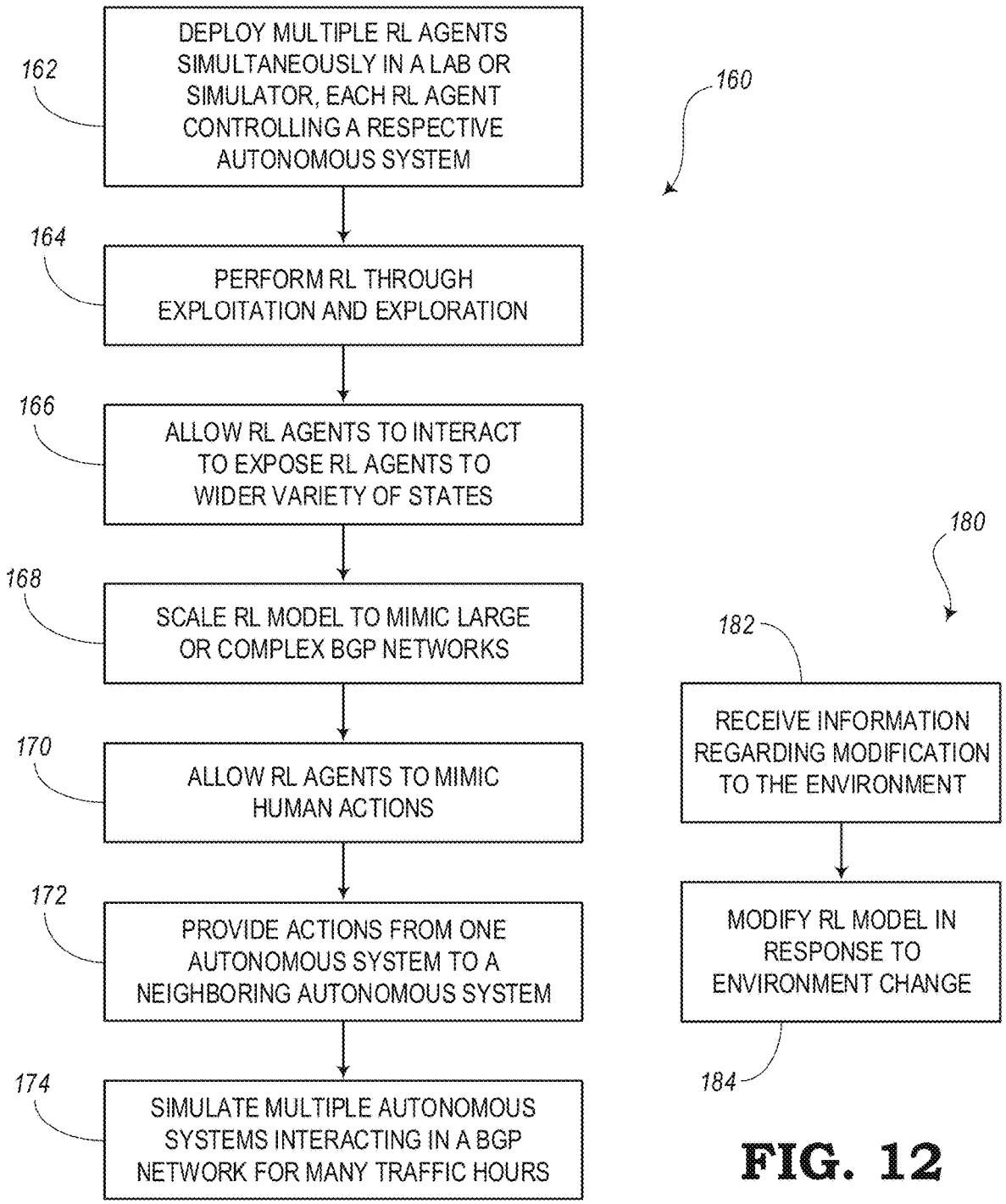
FIG. 11 is a flow diagram illustrating a method for training multiple RL agents to be incorporated into the telecommunications network of FIG. 1, according to various embodiments.
FIG. 12 is a flow diagram illustrating a method for optimizing BGP traffic in the telecommunications network of FIG. 1 when the network environment is modified, according to various embodiments.

FIG. 11 is a flow diagram illustrating an embodiment of a method 160 for training multiple RL agents in the telecommunications network 10. In this embodiment, the method 160 may be able to work around the fact that multiple ASs are controlled by different RL agents which may each have their own agenda and may attempt to influence the BGP traffic on the network based on their own specific point of view. This method 160 attempts to balance the effect of all the RL agents working together within the production network.

The method 160 may include a step (block 162) of deploying multiple RL agents simultaneously within a lab or simulator, where each AS is controlled by a different RL agent. Particularly, with the interactions of multiple RL agents operating with each other, each of the RL agents can concurrently perform RL processes to learn through exploration and exploitation strategies, as indicated in block 164. This allows the RL agents to interact, which has the potential of exposing the RL agents to a wider variety of states, as indicated in block 166, and to provide a more realistic simulation of the multi-AS environment when eventually deployed into production. In turn, this strategy can also provide superior policy pre-training accuracy.

Furthermore, this method 160 can be automated and scaled to mimic large or complex BGP networks, as indicated in block 168. Note that no human intervention is necessary during training. The method 160 further include a step (block 170) of enabling the RL agents to mimic human actions from neighboring ASs. When the RE agents are being deployed into production, actions of the neighboring AS can be taken either by expert humans or AIs, as indicated in block 172. This can be thought of as an extension of the Alpha Go Zero training program, where two RL agents played against each other during millions of games of Go, resulting in superhuman performance. In the present disclosure, however, the method 160 is used in the field of a BGP network, as indicated in block 174, so as to simulate multiple ASs interacting with each other in the BGP network for a long period of time, such as millions of traffic hours.

FIG. 12 is a flow diagram illustrating an embodiment of a method 180 for optimizing BGP traffic in the telecommunications network 10 when the network environment is modified. For instance, this method 180 may be useful after RL agents have already optimized a network, but then must be re-trained based on changes in the network. The method 180 may be an extension of one or both of method 150 (FIG. 10) and method 160 (FIG. 11) for handling modification of the environment. This allows the RL-based AI to train for scenarios like the addition of new links, new routes, new routers, new ASs, etc., within the network, which often occurs with current telecommunications networks.

Method 180 may include receiving information regarding the modification to the environment, as indicated in block 182. Also, a step of modifying the RL model after each environment change, as indicated in block 184, and leveraging any transfer learning strategies so as to import previous learning into the RL model.

The methods described above with respect to FIGS. 8-12 may be used in various situations for training RL-based AI. Any one or more of the multiple methods may be executed in order to know what actions are most effective under which circumstances. For example, method 140 (FIG. 9) may be an extension of NMS data-collection to cover states, rewards, and actions and may be configured to enable batch pre-training of RL agents from historical data of the production network itself.

In method 160 (FIG. 11), multiple RL agents may interact with each other and learn concurrently in a lab or simulated environment, where each RL agent is configured to control one respective AS. Method 160 may result in a more realistic representation of a multi-AS system for dynamically influencing BGP traffic on the Internet or other network. The method 160 can be automated and scaled to mimic large and complex BGP networks. This method 160 of FIG. 11, and/or other methods may be expanded to include the method 180 (FIG. 12), where multiple RL agents may be configured for learning in a changing lab or simulated environment.

Figure 13:
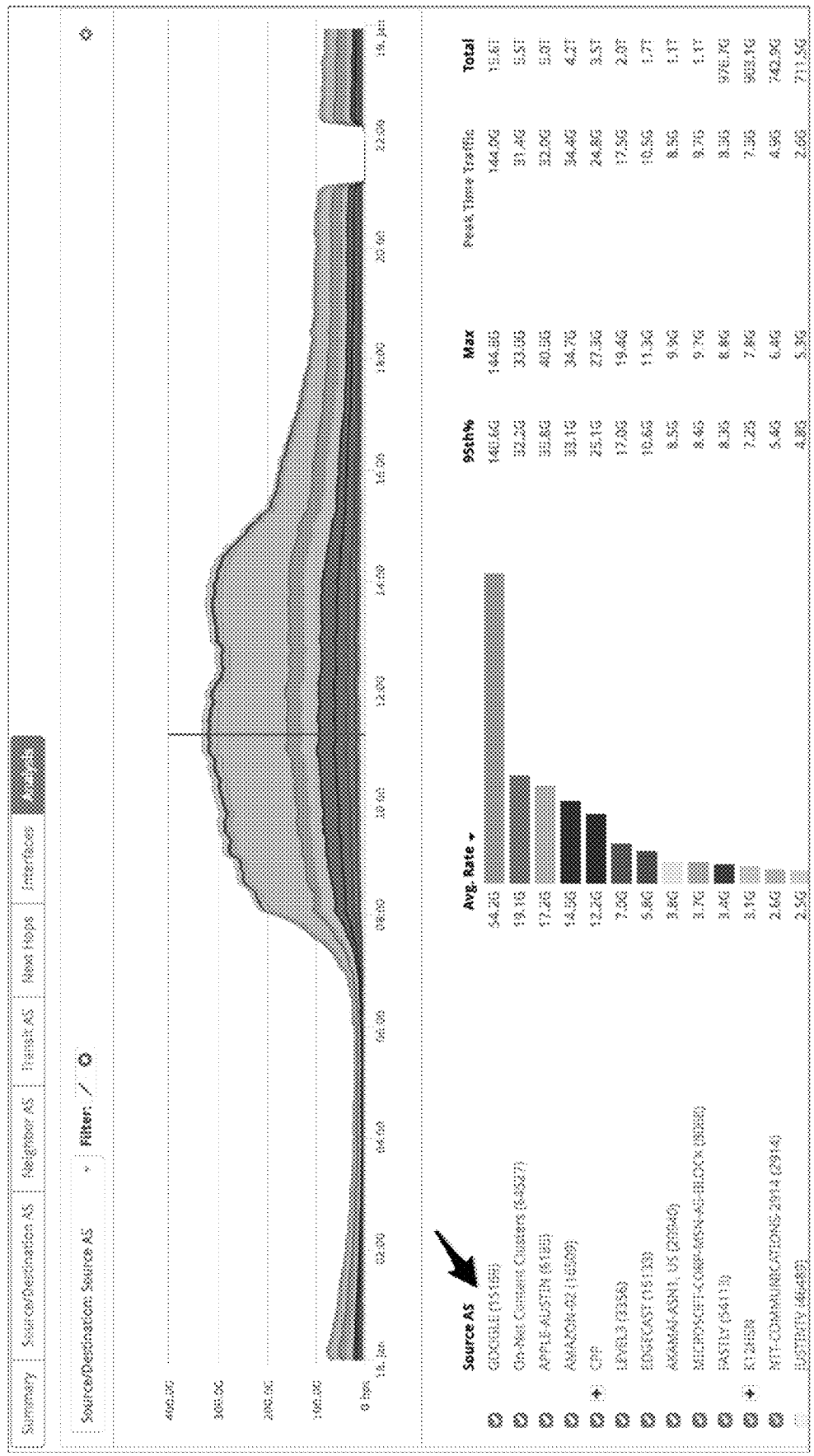
FIG. 13 is a graph illustrating a first example of anomaly detection for monitoring BGP peering traffic, according to various embodiments.
Figure 14:
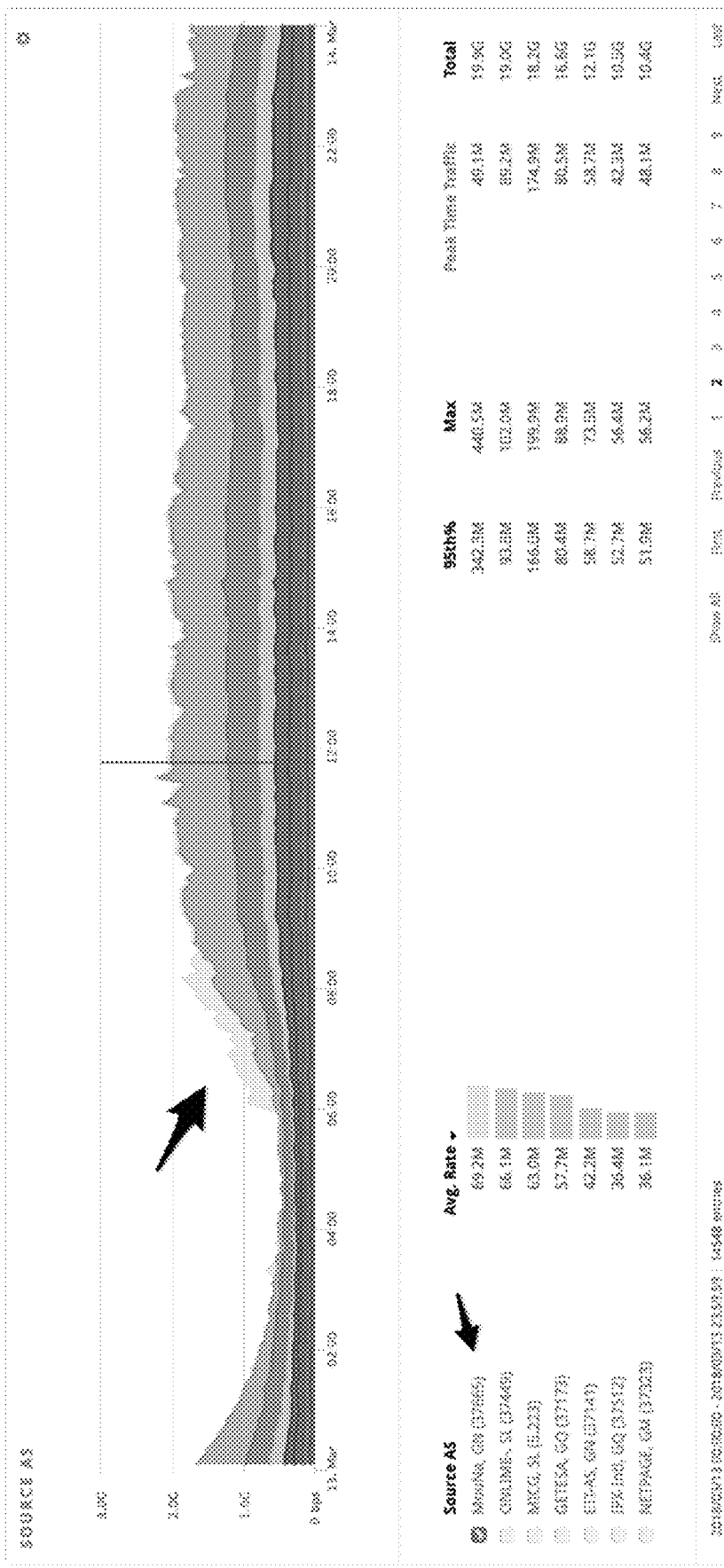
FIG. 14 is a graph illustrating a second example of anomaly detection for monitoring Distributed Denial of Service (DDoD), according to various embodiments.
Figure 15:
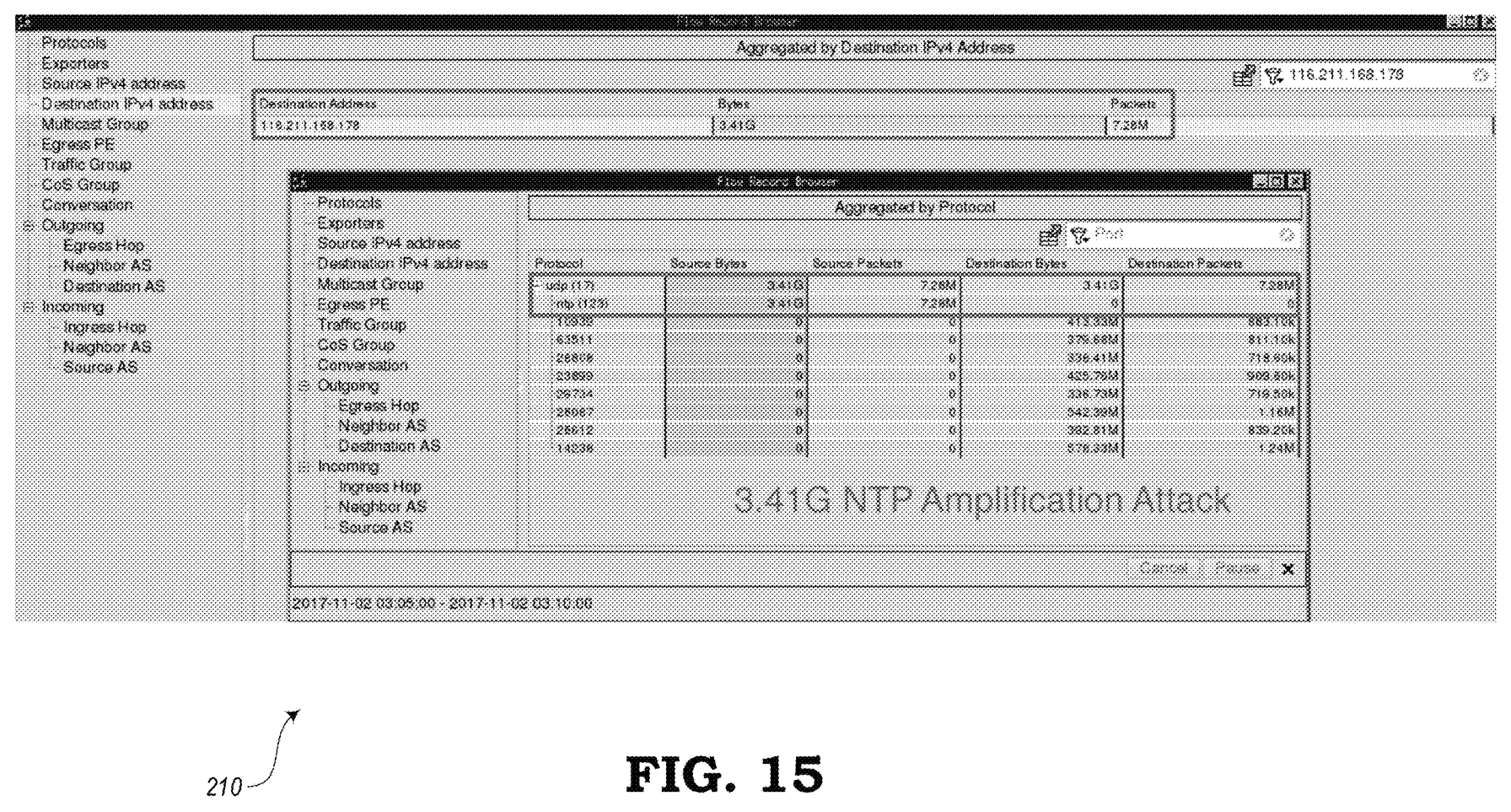

FIG. 13 is a graph 190 showing a first example of anomaly detection for monitoring BGP peering traffic. FIG. 14 is a graph 200 showing a second example of anomaly detection for monitoring Distributed Denial of Service (DDoD). Also, FIG. 15 is a graph 210 showing a third example of anomaly detection for monitoring Network Time Protocol (NTP) amplification attacks.

RL Process for BGP

Figure 16:
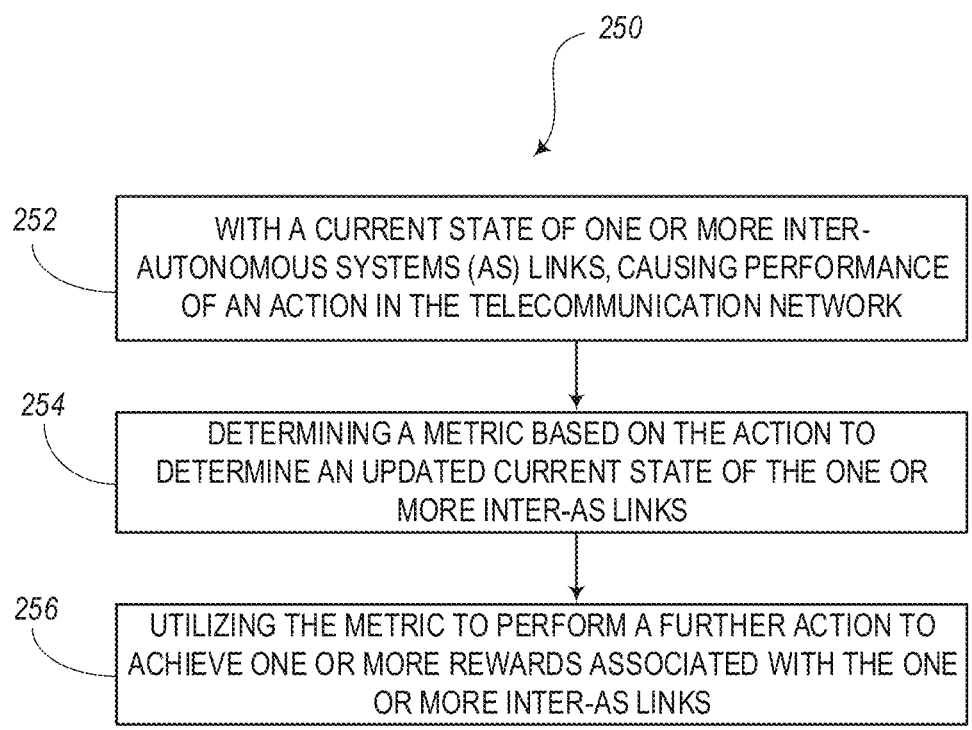
FIG. 16 is a flow diagram illustrating a method for optimizing Border Gateway Protocol (BGP) traffic in a telecommunications network.

FIG. 16 is a flow diagram of a method 250 for optimizing Border Gateway Protocol (BGP) traffic in a telecommunications network. The method 250 can be implemented in the RL agent 50, as instructions in a non-transitory computer-readable medium, and as a method. The method 250 includes, with a current state of one or more inter-Autonomous Systems (AS) links, causing performance of an action in the telecommunication network (step 252), determining a metric based on the action to determine an updated current state of the one or more inter-AS links (step 254), and utilizing the metric to perform a further action to achieve one or more rewards associated with the one or more inter-AS links (step 256).

The one or more rewards can relate to optimization of one or more of inbound traffic and outbound traffic on the one or more inter-AS links. The current state and the updated current state can be characterized by any of ingress traffic, egress traffic, latency, dropped packets, and business metrics. The action can be a direct action for outbound traffic on the one or more inter-AS links. The action can be an indirect action to influence inbound traffic on the one or more inter-AS links.

The method 250 can further include receiving training related to what actions are effective for the one or more rewards based on the current state. The training can include offline training using one of i) historical data based on actions taken in a production network, and ii) a simulation. The rewards can include balancing traffic across a plurality of inter-AS links, maximizing Quality of Experience, minimizing Service Layer Agreement penalties, minimizing a cost per bit, minimizing latency, minimizing a penalty to change routing data, and a combination thereof.

Although the present disclosure has been illustrated and described herein with reference to preferred embodiments and specific examples thereof, it will be readily apparent to those of ordinary skill in the art that other embodiments and examples may perform similar functions and/or achieve like results. All such equivalent embodiments and examples are within the spirit and scope of the present disclosure, are contemplated thereby, and are intended to be covered by the following claims.

What is claimed is:

1. A system configured to optimize Border Gateway Protocol (BGP) traffic in a telecommunications network, the system comprising:
    a network interface configured for communication with the telecommunications network;
    a processing device interconnected with the network interface; and
    a memory device configured to store instructions that, when executed, enable the processing device to
        perform an action in the telecommunications network when one or more inter-Autonomous System (AS) links are in a current state, wherein the action in the telecommunications network is configured to have an effect on BGP traffic flow on the one or more inter-AS links,
        define one or more metrics, describing a state of the one or more inter-AS links, based on the effect of the action on the BGP traffic flow,
        determine an updated current state of the one or more inter-AS links based on the defined one or more metrics, and
        utilize the defined one or more metrics to perform a further action to achieve one or more rewards associated with the one or more inter-AS links, wherein an offline simulation is utilized to determine which actions are effective for the one or more rewards based on the current state, the actions and the one or more rewards are based on reinforcement learning where the current state is mapped to some action to maximize the one or more rewards over time, wherein the reinforcement learning seeks to learn what to do given a problem, in the BGP traffic flow, for the current state being mapped to the some action.

2. The system of claim 1, wherein the one or more rewards relate to optimization of one or more of inbound traffic and outbound traffic on the one or more inter-AS links.

3. The system of claim 1, wherein the defined one or more metrics, which characterizes the current state and the updated current state of the inter-AS links, is a measurement based on any of ingress traffic, egress traffic, latency, dropped packets, and business metrics.

4. The system of claim 1, wherein the action is a direct action for outbound traffic on the one or more inter-AS links.

5. The system of claim 1, wherein the action is an indirect action to influence inbound traffic on the one or more inter-AS links.

6. The system of claim 1, wherein the one or more rewards include one or more of
balancing traffic across a plurality of inter-AS links,
maximizing Quality of Experience,
minimizing Service Layer Agreement penalties,
minimizing a cost per bit,
minimizing latency, and
minimizing a penalty to change routing data.

7. The system of claim 1, wherein the offline simulation includes a plurality of reinforcement learning agents including one for control of each AS.

8. The system of claim 7, wherein the plurality of reinforcement learning agents operate simultaneously in the offline simulation to concurrently learn through exploration and exploitation strategies.

9. A non-transitory computer-readable medium comprising software logic adapted to optimize Border Gateway Protocol (BGP) traffic in a telecommunications network, the software logic, when executed by a processor of a processing device, enabling the processing device to:
perform an action in the telecommunications network when one or more inter-Autonomous Systems (AS) links are in a current state, wherein the action in the telecommunications network is configured to have an effect on BGP traffic flow on the one or more inter-AS links,
define one or more metrics, describing a state of the one or more inter-AS links, based on the effect of the action on the BGP traffic flow,
determine an updated current state of the one or more inter-AS links based on the defined one or more metrics, and
utilize the defined one or more metrics to perform a further action to achieve one or more rewards associated with the one or more inter-AS links, wherein an offline simulation is utilized to determine which actions are effective for the one or more rewards based on the current state, the actions and the one or more rewards are based on reinforcement learning where the current state is mapped to some action to maximize the one or more rewards over time, wherein the reinforcement learning seeks to learn what to do given a problem, in the BGP traffic flow, for the current state being mapped to the some action.

10. The non-transitory computer-readable medium of claim 9, wherein the one or more rewards relate to optimization of one or more of inbound traffic and outbound traffic on the one or more inter-AS links.

11. The non-transitory computer-readable medium of claim 9, wherein the defined one or more metrics, which characterizes the current state and the updated current state of the inter-AS links, is a measurement based on any of ingress traffic, egress traffic, latency, dropped packets, and business metrics.

12. The non-transitory computer-readable medium of claim 9, wherein the action is a direct action for outbound traffic on the one or more inter-AS links.

13. The non-transitory computer-readable medium of claim 9, wherein the action is an indirect action to influence inbound traffic on the one or more inter-AS links.

14. The non-transitory computer-readable medium of claim 9, wherein the one or more rewards include one or more of
balancing traffic across a plurality of inter-AS links,
maximizing Quality of Experience,
minimizing Service Layer Agreement penalties,
minimizing a cost per bit,
minimizing latency, and
minimizing a penalty to change routing data.

15. The non-transitory computer-readable medium of claim 9, wherein the offline simulation includes a plurality of reinforcement learning agents including one for control of each AS.

16. The non-transitory computer-readable medium of claim 15, wherein the plurality of reinforcement learning agents operate simultaneously in the offline simulation to concurrently learn through exploration and exploitation strategies.

17. A method comprising:
performing an action in a telecommunications network when one or more inter-Autonomous Systems (AS) links are in a current state, wherein action in the telecommunications network is configured to have an effect on BGP traffic flow on the one or more inter-AS links,
defining one or more metrics, describing a state of the one or more inter-AS links, based on the effect of the action on the BGP traffic flow,
determining an updated current state of the one or more inter-AS links based on the defined one or more metrics, and
utilizing the defined one or more metrics to perform a further action to achieve one or more rewards associated with the one or more inter-AS links, wherein an offline simulation is utilized to determine which actions are effective for the one or more rewards based on the current state, the actions and the one or more rewards are based on reinforcement learning where the current state is mapped to some action to maximize the one or more rewards over time, wherein the reinforcement learning seeks to learn what to do given a problem, in the BGP traffic flow, for the current state being mapped to the some action.

18. The method of claim 17, wherein the one or more rewards relate to optimization of one or more of inbound traffic and outbound traffic on the one or more inter-AS links.

19. The method of claim 17, wherein the defined one or more metrics, which characterizes the current state and the updated current state of the inter-AS links, is a measurement based on any of ingress traffic, egress traffic, latency, dropped packets, and business metrics.

20. The method of claim 17, wherein the action is one of
a direct action for outbound traffic on the one or more inter-AS links, and
an indirect action to influence inbound traffic on the one or more inter-AS links.

* * * * *